(12) United States Patent
Wang et al.

(10) Patent No.: US 10,755,995 B2
(45) Date of Patent: Aug. 25, 2020

(54) WARPAGE CONTROL OF SEMICONDUCTOR DIE

(71) Applicant: TAIWAN SEMICONDUCTOR MANUFACTURING CO., LTD., Hsinchu (TW)

(72) Inventors: Yun-Ting Wang, Taichung (TW); Yi-An Lin, Taichung (TW); Ching-Chuan Chang, Taichung (TW); Po-Chang Kuo, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/402,042

(22) Filed: May 2, 2019

(65) Prior Publication Data
US 2020/0006182 A1 Jan. 2, 2020

Related U.S. Application Data

(60) Provisional application No. 62/691,516, filed on Jun. 28, 2018.

(51) Int. Cl.
| | |
|---|---|
| *H01L 21/4763* | (2006.01) |
| *H01L 23/31* | (2006.01) |
| *H01L 23/00* | (2006.01) |
| *H01L 23/29* | (2006.01) |
| *H01L 21/02* | (2006.01) |
| *H01L 21/56* | (2006.01) |

(52) U.S. Cl.
CPC ...... *H01L 23/3171* (2013.01); *H01L 21/0228* (2013.01); *H01L 21/02211* (2013.01); *H01L 21/02274* (2013.01); *H01L 21/563* (2013.01); *H01L 23/291* (2013.01); *H01L 23/3192* (2013.01); *H01L 24/09* (2013.01); *H01L 24/17* (2013.01); *H01L 2224/0401* (2013.01); *H01L 2924/3511* (2013.01); *H01L 2924/3512* (2013.01)

(58) Field of Classification Search
CPC ............... H01L 33/44; H01L 23/291; H01L 2924/3511; H01L 23/3192
USPC ........ 438/622, 624, 637; 257/635, 637, 758, 257/784
See application file for complete search history.

(56) References Cited

U.S. PATENT DOCUMENTS

| | | | |
|---|---|---|---|
| 6,576,551 B1 * | 6/2003 | Chang | H01L 21/3212 257/E21.304 |
| 8,318,519 B2 * | 11/2012 | Doan | H01L 33/0079 257/E33.066 |
| 2005/0242446 A1 * | 11/2005 | Jin | H01L 24/03 257/779 |

(Continued)

*Primary Examiner* — S. V. Clark
(74) *Attorney, Agent, or Firm* — Maschoff Brennan

(57) ABSTRACT

A method is provided. A bottom passivation layer is formed on a dielectric layer over a semiconductor substrate. Then, a first opening is formed in the bottom passivation layer to expose a portion of the dielectric layer. Next, a metal pad is formed in the first opening. Afterwards, a first oxide-based passivation layer is formed over the metal pad. Then, a second oxide-based passivation layer is formed over the first oxide-based passivation layer. The second oxide-based passivation layer has a hardness less than a hardness of the first oxide-based passivation layer.

20 Claims, 18 Drawing Sheets

(56) References Cited

U.S. PATENT DOCUMENTS

| | | | | |
|---|---|---|---|---|
| 2006/0091536 A1* | 5/2006 | Huang | .................... | H01L 24/05 |
| | | | | 257/734 |
| 2009/0263963 A1* | 10/2009 | Furusawa | ......... | H01L 21/31633 |
| | | | | 438/627 |
| 2013/0241058 A1* | 9/2013 | Yu | .......................... | H01L 24/48 |
| | | | | 257/738 |

* cited by examiner

WARPAGE CONTROL OF SEMICONDUCTOR DIE

PRIORITY CLAIM AND CROSS-REFERENCE

This application claims the benefit of the Provisional Application Serial No. 62/691,516, filed on Jun. 28, 2018. The entire disclosure of the above application is hereby incorporated by reference herein.

BACKGROUND

The semiconductor industry has experienced rapid growth due to continuous improvement in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed, and greater bandwidth, as well as lower power consumption and latency has grown recently, there has been an accompanying growth in the need for smaller and more creative packaging techniques for semiconductor dies.

Using the packaging techniques, the semiconductor dies having the electronic components may be electrically connected to an external device, for example, a printed-circuit board (PCB). During a packaging process for forming a package structure having the semiconductor dies and the external device, several depositing, etching, and heating operations may be performed. In such a packaging process, substrate warpage is a common problem that often occurs due to different thermal expansion coefficients of a variety of layers in the semiconductor dies. A solution to tackle the problem is required.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
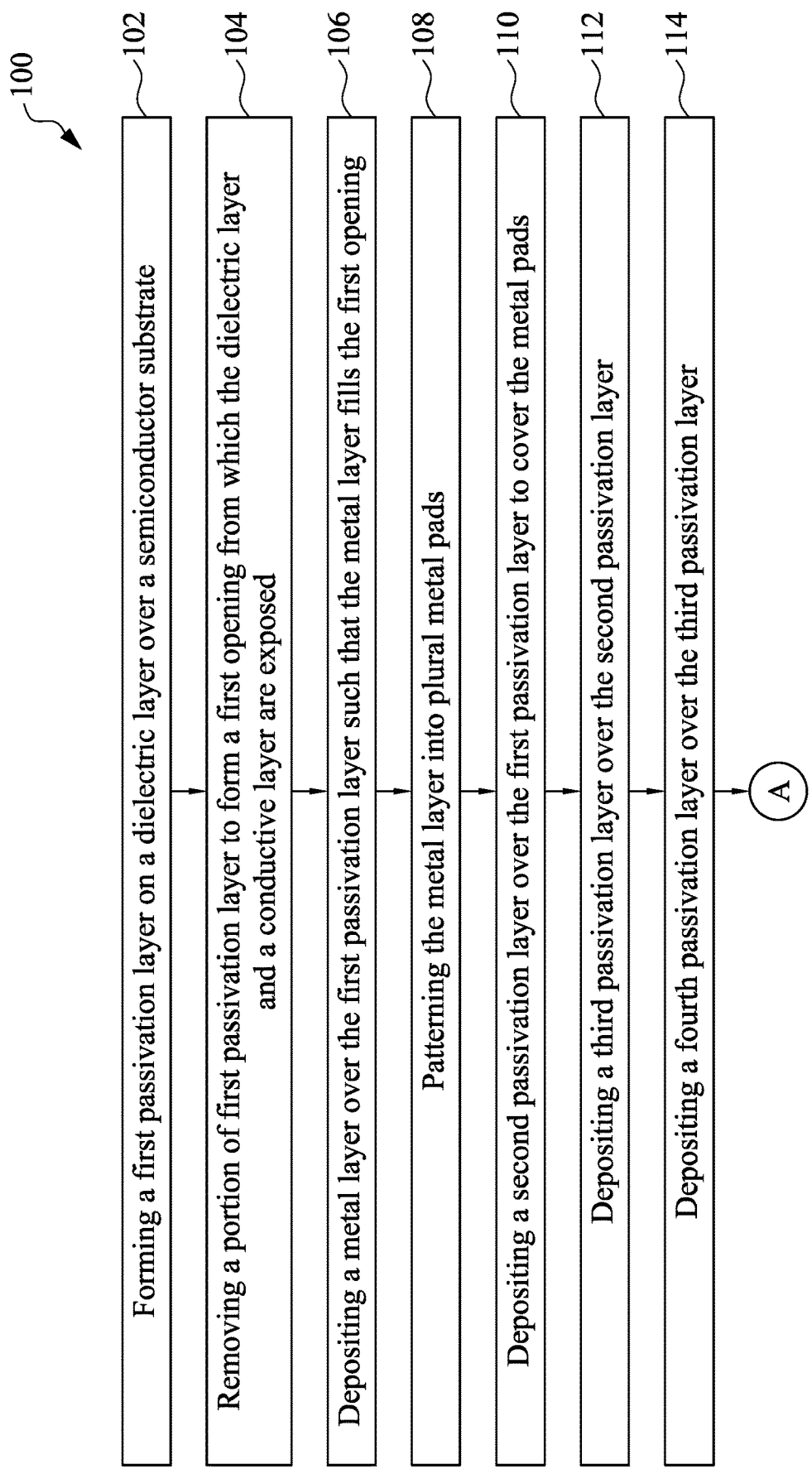
FIG. 1A and FIG. 1B are flow charts showing a method of controlling warpage in packaging in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package structure including a printed circuit board (PCB) and a die bonded to the PCB may be formed by various depositing, etching and heating operations, in which one of the operations may be a reflow operation for bumping the die onto the PCB. In the reflow operation, the package structure is subjected to several thermal treatments under different temperatures. A change of the temperatures in the reflow operation causes die (substrate) warpage, especially when one or more passivation layers having greater thickness and greater hardness are formed in the die to reduce a risk of die cracks. Such die warpage gets worse when the package structure includes two dies on opposite sides of a double-sided PCB, leading to a concern of double-sided board level reliability (B2LR). For example, delamination may occur in two layers of each of the dies, in which the two layers may be two metal layers in an electrical connection structure of the die. Reducing the thickness of the passivation layer having greater hardness may improve the substrate warpage problem. However, mechanical strength of the die is also reduced because of the reduced thickness of the harder passivation layer. Without sufficient mechanical strength, die cracks may occur.

Embodiments of the present disclosure are directed to providing a semiconductor die and a method for controlling warpage in packaging. In some embodiments, plural passivation layers having different hardness are sequentially formed over a semiconductor substrate of the die. To form such passivation layers, different deposition operations with different deposition rates are used, so as to form at least one of the passivation layers that is densely packed and the other passivation layers that are loosely packed. In some embodiments, a thickness of the densely packed passivation layer (or having the greater hardness) is reduced, and a passivation layer that is loosely packed (i.e., having smaller hardness) is additionally formed on the densely packed passivation layer, so that the problems of the substrate warpage can be tackled and the risk of the die cracks is also reduced. Said passivation layers form a composite passivation layer having sufficient mechanical strength, lower thermal stress and higher fracture toughness. Therefore, substrate warpage is reduced and the reliability of the package structure is improved.

Figure 1B:
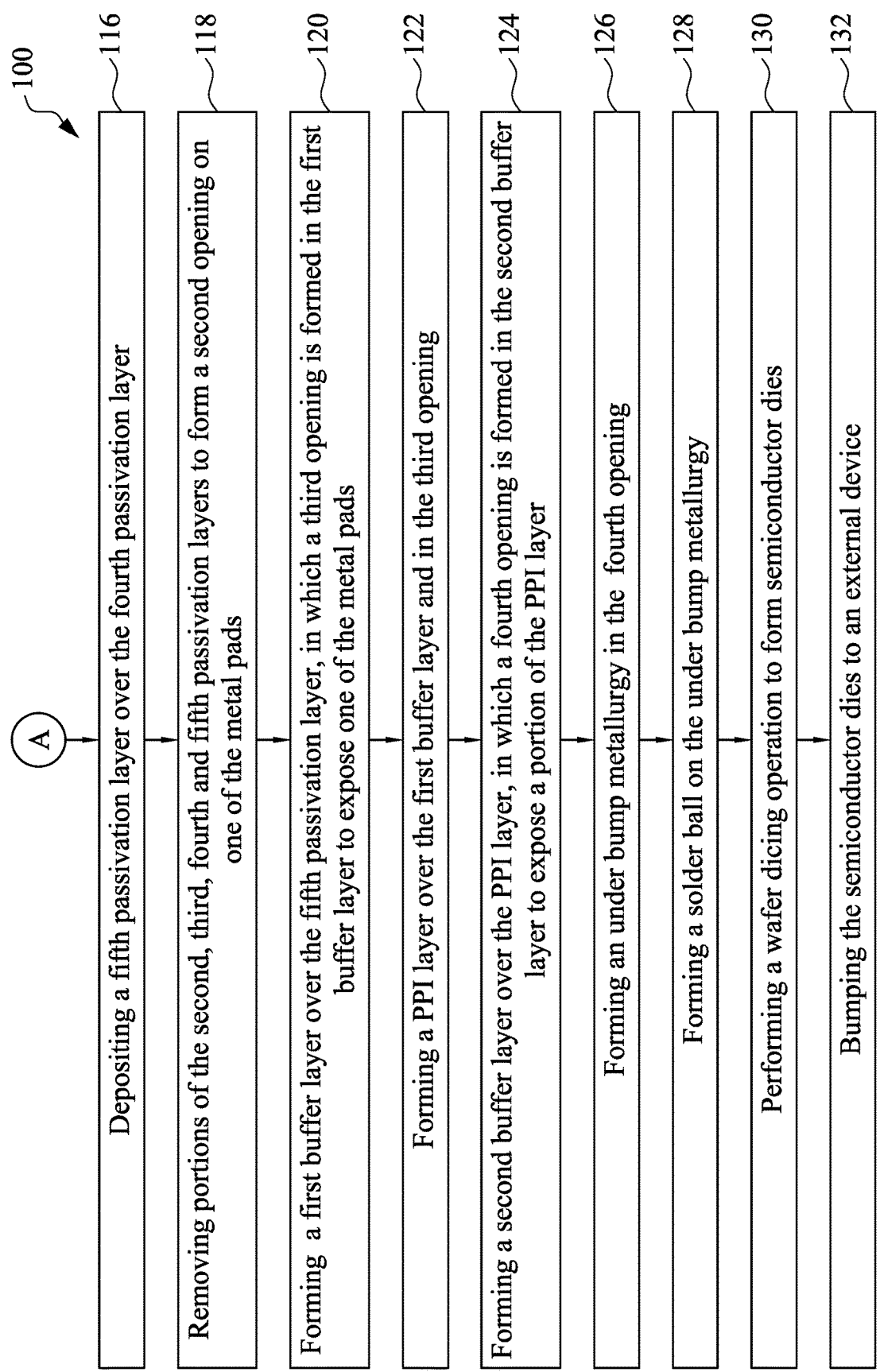
Figure 2:
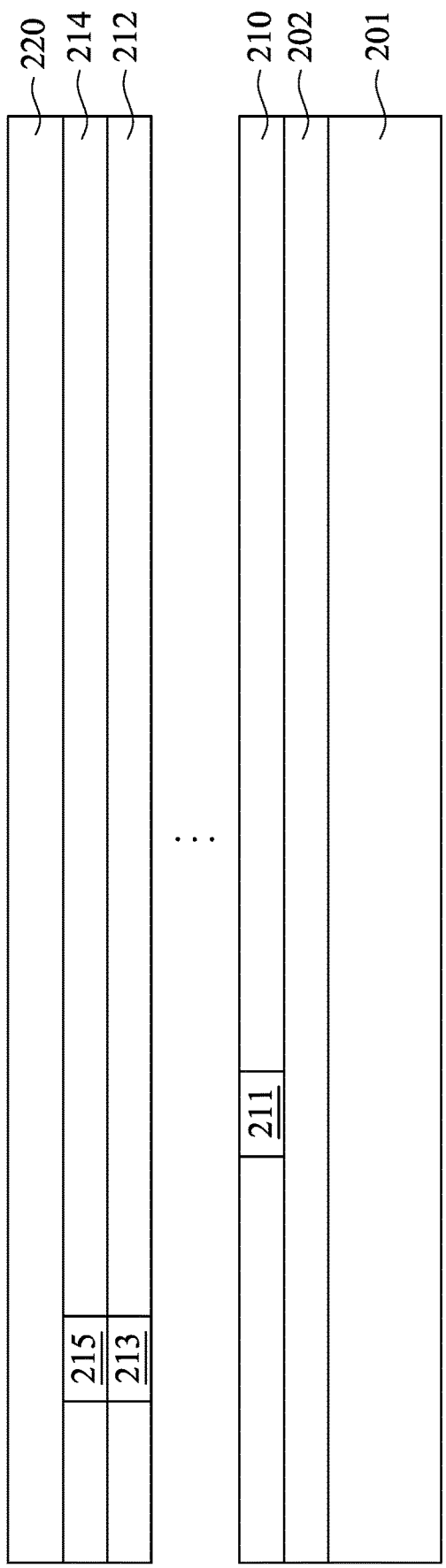
FIG. 2 through FIG. 16 are cross-sectional views showing a method for controlling warpage in packaging at various stages.

FIG. 1A and FIG. 1B are flow charts showing a method 100 of controlling warpage in packaging in accordance with some embodiments of the present disclosure. FIG. 2 through FIG. 16 are cross-sectional views showing a method for controlling warpage in packaging at various stages. FIG. 2 illustrates an initial structure including a semiconductor substrate 201. The semiconductor substrate 201 may be a silicon substrate. Alternatively, the semiconductor substrate 201 may be a silicon-on-insulator substrate. The semiconductor substrate 201 may further include a variety of electrical circuits (not shown). The electrical circuits formed on the semiconductor substrate 201 may be any type of circuitry suitable for a particular application.

In accordance with some embodiments, the electrical circuits may include various n-type metal-oxide semiconductor (NMOS) and/or p-type metal-oxide semiconductor (PMOS) devices such as transistors, capacitors, resistors, diodes, photo-diodes, fuses and the like. The electrical circuits may be interconnected to perform one or more functions. The functions may include memory structures, processing structures, sensors, amplifiers, power distribution, input/output circuitry or the like. It is understood that the above examples are provided for illustrative purposes only to further explain applications of the present disclosure and are not meant to limit the present disclosure in any manner.

An interlayer dielectric layer 202 is formed on top of the semiconductor substrate 201. The interlayer dielectric layer 202 may be formed, for example, of a low-K dielectric material, such as silicon oxide. The interlayer dielectric layer 202 may be formed by any suitable method known in the art, such as spinning, chemical vapor deposition (CVD) and plasma enhanced chemical vapor deposition (PECVD). It should also be noted that one skilled in the art will recognize that the interlayer dielectric layer 202 may further include plural dielectric layers.

A bottom metallization layer 210 and a top metallization layer 212 are formed over the interlayer dielectric layer 202. As shown in FIG. 2, the bottom metallization layer 210 includes a first metal line 211. Likewise, the top metallization layer 212 includes a second metal line 213. Metal lines 211 and 213 are formed of metal materials such as copper or copper alloys and the like. The metallization layers 210 and 212 may be formed through any suitable techniques (e.g., deposition, damascene and the like). Generally, the one or more inter-metal dielectric layers and the associated metallization layers are used to interconnect the electrical circuits in the semiconductor substrate 201 to each other to form functional circuitry and to further provide an external electrical connection.

It is noted while FIG. 2 shows the bottom metallization layer 210 and the top metallization layer 212, one or more inter-metal dielectric layers (not shown) and the associated metallization layers (not shown) may be formed between the bottom metallization layer 210 and the top metallization layer 212. In particular, the layers between the bottom metallization layer 210 and the top metallization layer 212 may be formed by alternating layers of dielectric (e.g., extremely low-k dielectric material) and conductive materials (e.g., copper).

A dielectric layer 214 is formed on top of the top metallization layer 212. As shown in FIG. 2, a top metal connector 215 is embedded in the dielectric layer 214. In particular, the top metal connector 215 provides a conductive channel for the metal line 213 and the electrical connection structure of the semiconductor device. The top metal connector 215 may be made of metallic materials such as copper, copper alloys, aluminum, silver, gold and any combinations thereof. The top metal connector 215 may be formed by suitable techniques such as CVD. Alternatively, the top metal connector 215 may be formed by sputtering, electroplating and the like.

Reference is made to FIG. 1A and FIG. 2. At operation 102, a first passivation layer 220 is deposited on the dielectric layer 214 over a semiconductor substrate 201. In some embodiments, the first passivation layer 220 includes a material such as undoped silicate glass (USG), silicon nitride (SiN), silicon dioxide (SiO$_2$) or silicon oxynitride (SiON). In some embodiments, the first passivation layer 220 may be deposited by chemical vapor deposition (CVD), spin-coating, or other suitable techniques. The first passivation layer 220 may protect the metal lines 211 and 213 and top metal connector 215. In some embodiments, the first passivation layer 220 includes a nitride layer and an oxide layer on the nitride layer. In such embodiments, a thickness of the nitride layer may be in a range from about 50 nm to about 100 nm. In such embodiments, a thickness of the oxide layer may be in a range from about 200 nm to about 1000 nm. The first passivation 220 having these layers possesses better electrical insulation properties and provides for better electrical protection.

Figure 3:
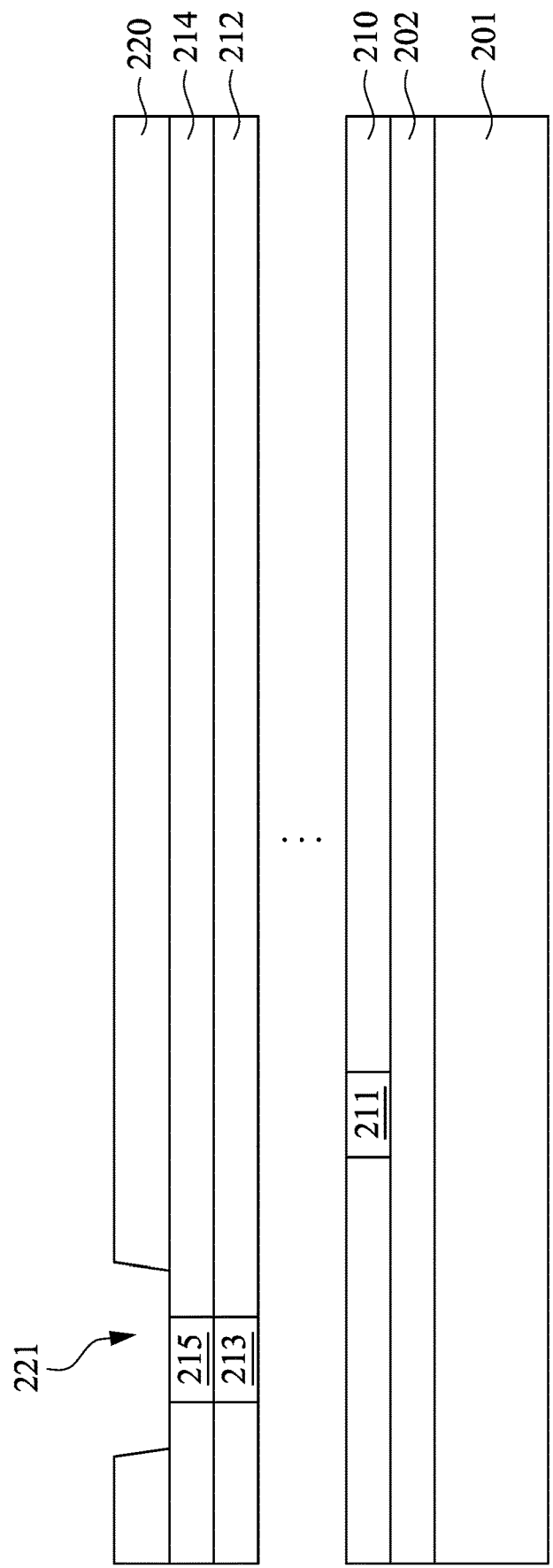

Reference is made to FIG. 1A and FIG. 3. At operation 104, a portion of the first passivation layer 220 is removed to form a first opening 221, and the dielectric layer 214 and a conductive layer (e.g., the top metal connector 215) are exposed through the first opening 221. In some embodiments, removal of the first passivation layer 220 may be performed by forming a photoresist layer (not shown) over the first passivation layer 220, patterning the photoresist layer using suitable lithography techniques, followed by an etching operation to form the first opening 221.

Figure 4:
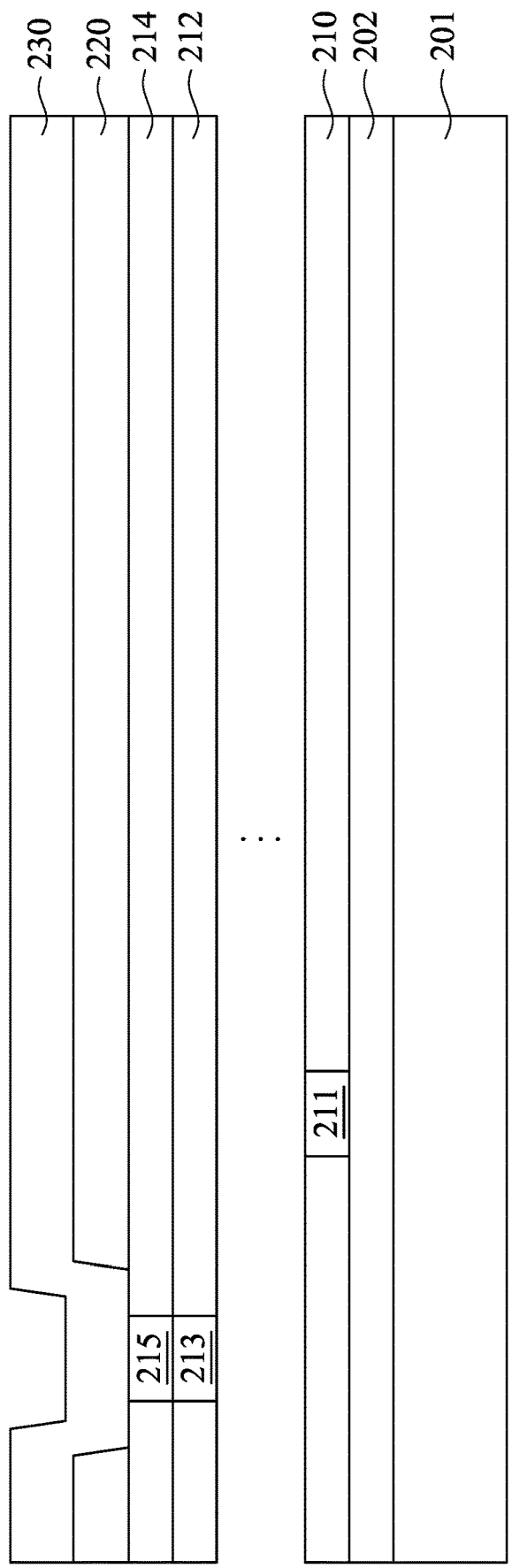

Reference is made to FIG. 1A, FIG. 3 and FIG. 4. At operation 106, a metal layer 230 is deposited over the first passivation layer 220 such that the metal layer 230 fills the first opening 221. In some embodiments, deposition of the metal layer 230 may be performed by physical vapor deposition (PVD), CVD, sputtering, plating or other suitable processes. In some embodiments, the metal layer 230 may include aluminum, aluminum alloy, copper, copper alloy or combinations thereof. For example, the metal layer 230 is formed of aluminum or aluminum alloy and thus can be referred to as an aluminum pad.

Figure 5:
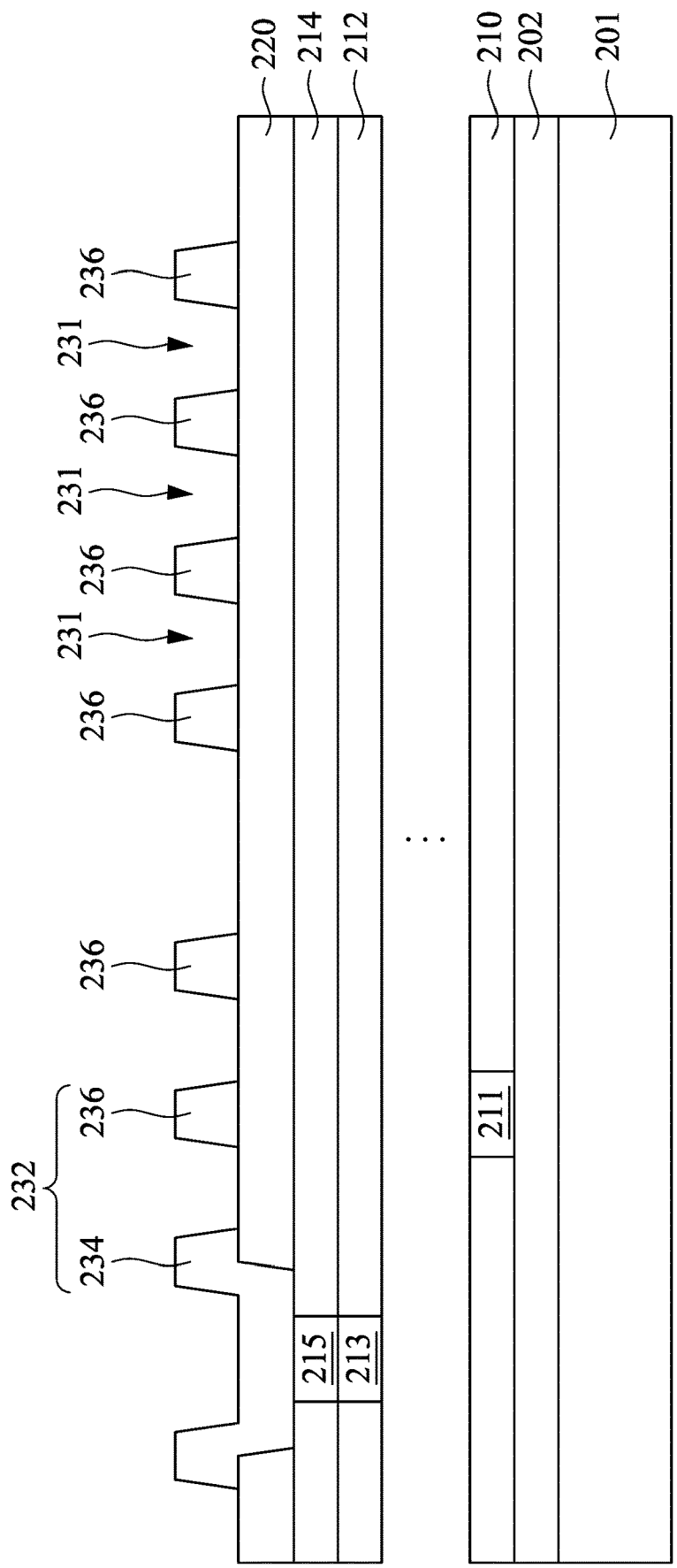

Reference is made to FIG. 1A, FIG. 4 and FIG. 5. At operation 108, the metal layer 230 is patterned by a photolithography operation and an etching operation, thereby forming plural metal pads 232. In some embodiments, the metal pads 232 include a first metal pad 234 that is formed in the first opening 221 over the dielectric layer 214, and second metal pads 236 formed on the first passivation layer 220. In some embodiments, the first metal pad 234 electrically contacts the underlying top metal connector 215, so as to provide electrical connection between the underlying integrated circuit to other external devices (e.g., a printed circuit board (PCB)). In some embodiments, a height of each of the second metal pads 236 may be in a range from about 1400 nm to about 2800 nm. The second metal pads 236 having such height are able to improve the electrical connection between the solder ball and the passivation interconnection layer(s). In some embodiments, after the metal layer 230 is patterned into the metal pads 232, several gaps 231 are formed between adjacent two of the second metal pads 236. Each gap 231 may have the same or different dimensions depending on the design of the package structure.

As described above, a composite passivation layer including several passivation layers having different hardness is then formed to improve the die warpage. Operations 110, 112, 114 and 116 of FIG. 1A and FIG. 1B for forming the composite passivation layer is described below with reference to cross sectional views of intermediate stages of the formation of the composite passivation layer shown in FIG. 6 through FIG. 9. Each of the passivation layers has its own hardness and thickness, such that the composite passivation layer has low thermal stress, high fracture toughness and sufficient mechanical strength. A thickness of each of the passivation layers may be corresponded to a thickness of the passivation layer over the top of the second metal pads 236 unless particularly stated otherwise.

Figure 6:
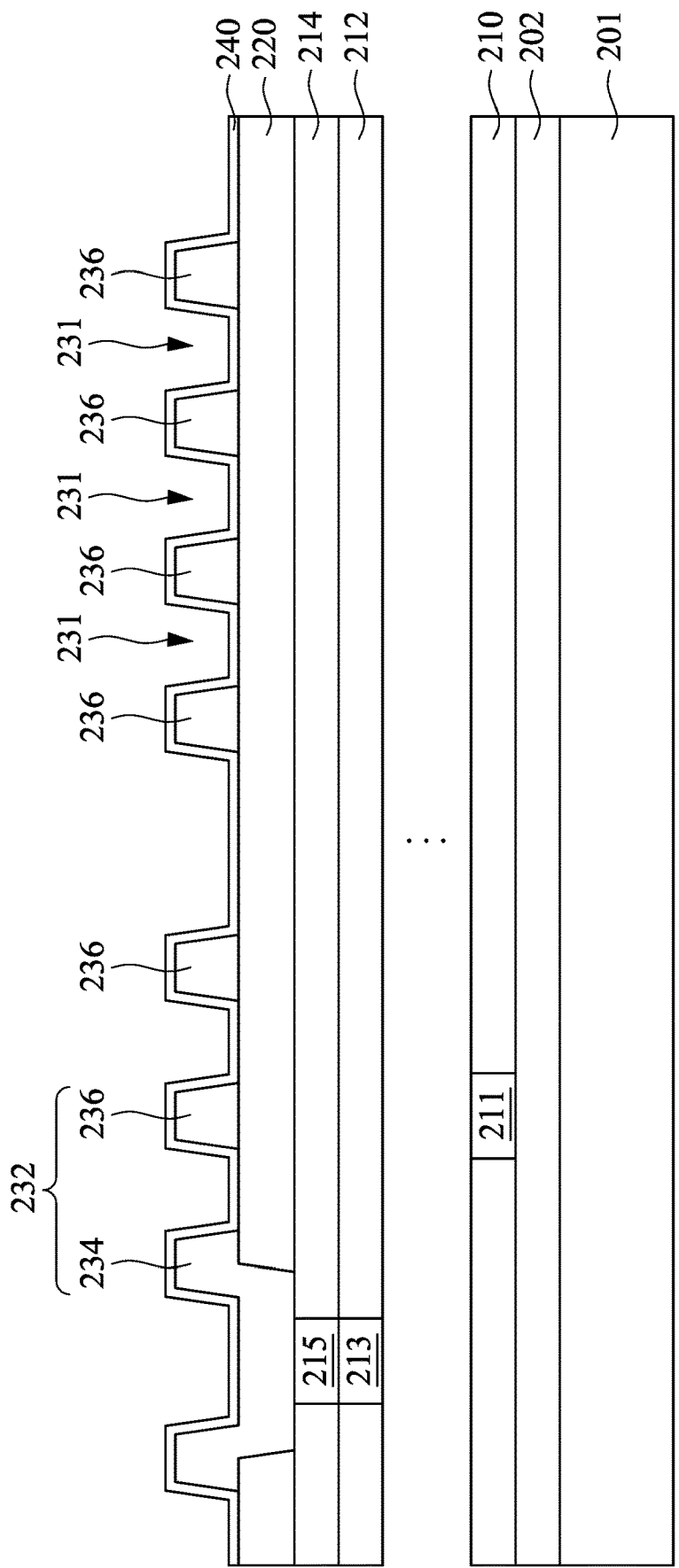

Reference is made to FIG. 1A and FIG. 6. At operation 110, a second passivation layer 240 is conformally deposited over the first passivation layer 220 to cover the metal pads 232. In some embodiments, the second passivation layer 240 having a first hardness is formed by a deposition operation having a deposition rate in a range from about 10 nm/second to about 30 nm/second. When the deposition rate is within such a range, a desired hardness of the second passivation layer 240 may be realized. For example, the first hardness of the second passivation layer 240 may be in a range from about 8 GPa to about 12 GPa. If the first hardness is smaller than about 8 GPa, the second passivation layer 240 may not provide sufficient protection to the underlying structures; however, if the first hardness is greater than about 12 GPa, delamination may occur between two adjacent passivation layers. In some embodiments, a thickness of the second passivation layer 240 is in a range from about 50 nm to about 400 nm. When a thickness of the second passivation layer 240 is smaller than about 50 nm, the second passivation layer 240 cannot provide sufficient protection to its underlying structures, causing charge accumulation in a subsequent operation (e.g., deposition of other passivation layer (s)) using a higher power). The charge accumulation may cause a change in a threshold voltage ($V_t$) or saturation current ($I_{sat}$) of the electrical components arranged in the semiconductor substrate 201. On the other hand, when the thickness of the second passivation layer 240 is greater than about 400 nm, tops of the gaps 231 between adjacent two of the second metal pads 236 are likely to be sealed (i.e., portions of the second passivation layer 240 on the tops of adjacent two second metal pads 236 contact each other), which increases challenges for subsequent gap filling operations. The unfilled gaps (or voids) may reduce the mechanical strength of the semiconductor die. In some embodiments, the second passivation layer 240 is formed of silicon oxide such as undoped silicate glass (USG) or silicon dioxide ($SiO_2$). In some further embodiments, reduced modulus of the second passivation layer 240 may be in a range from about 68 GPa to about 102 GPa, and the second passivation layer 240 having the reduced modulus within such range may provide proper stress. When the reduced modulus of the second passivation layer 240 is not within such range, the adhesion between the second passivation layer 240 and its adjacent layer (e.g., the first passivation layer 220 or a subsequently formed passivation layer overlying the second passivation layer) may be unsatisfactory, In other embodiments, a coefficient of thermal expansion (CTE) of the second passivation layer 240 may be in a range from about 0.48 ($*10^{-6 \cdot \circ} C.^{-1}$) to about 0.72 ($*10^{-6 \cdot \circ} C.^{-1}$), so that the adhesion between the second passivation layer 240 and its adjacent layer (e.g., the first passivation layer 220 or a subsequently formed passivation layer overlying the second passivation layer) may be satisfactory.

In some embodiments, the second passivation layer 240 may be made of USG which is formed by plasma enhanced CVD (PECVD). In some embodiments, the PECVD is performed at a temperature of about 300° C. to about 500° C. by using silane (e.g., $SiH_4$) and $N_2O$ as precursors. When the temperature is about 300° C. to about 500° C., the second passivation layer 240 may have a desired atomic ratio of silicon to oxygen (Si/O) for realizing a predetermined refractive index and extinction coefficient for its subsequent application, for example, Si/O may be in a range from about 1 to about 4. Ratio as used herein may refer to a resulting value of two values after said two values have been divided. In yet another embodiment, a flow rate of the silane precursor is in a range from about 600 sccm to about 750 sccm. In some other embodiments, a flow rate of the $N_2O$ is in a range from about 12000 sccm to about 20000 sccm. The flow rate of the precursors may impact both the deposition rate and the atomic ratio of the silicon to oxygen. When the flow rates of the precursors are controlled, properties such as the hardness, the refractive index or the extinction coefficient may be controlled satisfactorily.

Figure 7:
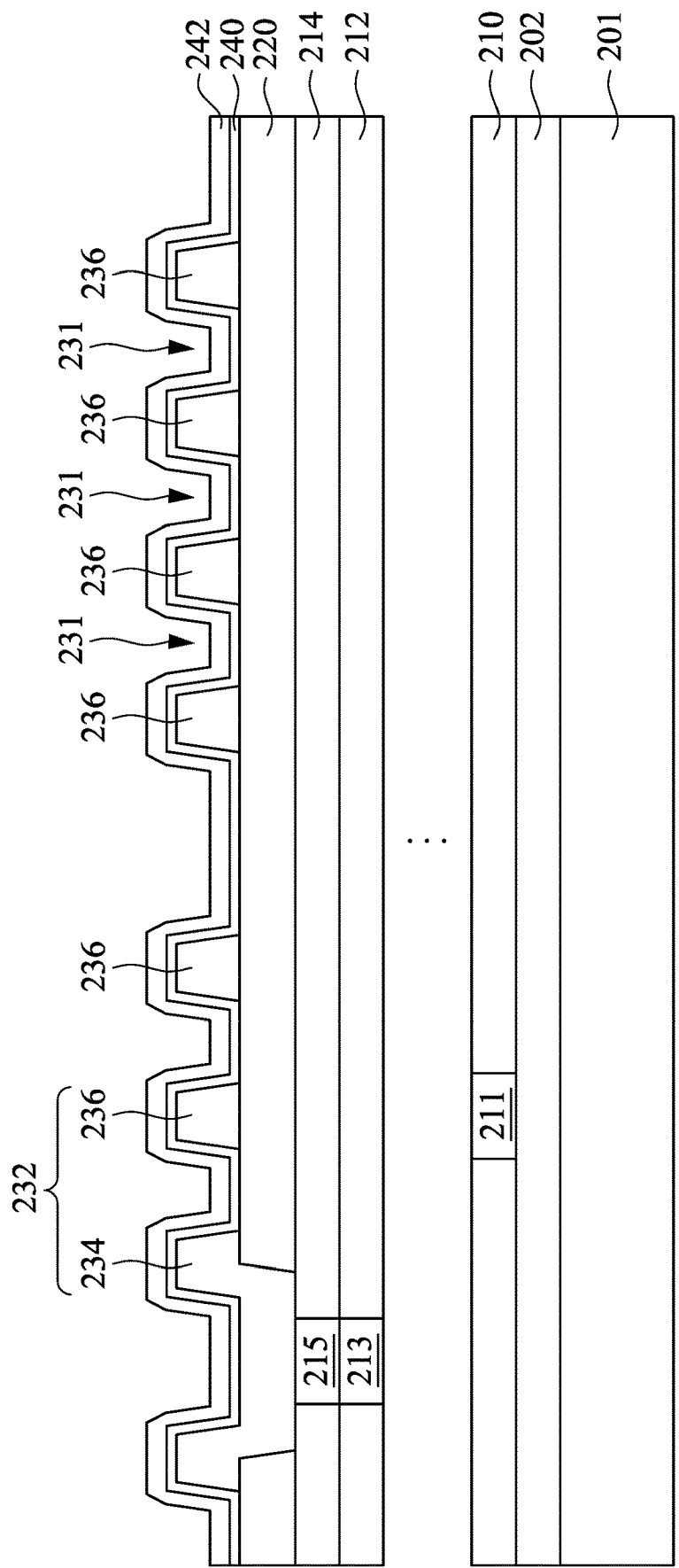

Reference is made to FIG. 1A and FIG. 7. At operation 112, a third passivation layer 242 is deposited over the second passivation layer 240. The third passivation layer 242 is relatively thick and compact (i.e., having a high hardness), and thus the third passivation layer 242 has a stronger mechanical strength compared to, for example, the second passivation layer 240. However, the third passivation layer 242 bears a higher thermal stress than the second passivation layer 240 when temperature varies, because the third passivation layer 242 is harder than the second passivation layer 240. For example, the third passivation layer 242 would bear a higher compressive stress than the second passivation layer 240 when the package temperature cools down, thus leading to increased warpage in the third passivation layer 242 and hence B2LR test failure.

In some embodiments, the third passivation layer 242 having a second hardness is formed by a deposition operation having a deposition rate in a range from about 5 nm/second to about 15 nm/second. When the deposition rate is within such a range, a desired hardness of the third passivation layer 242 may be realized. For example, the second hardness of the third passivation layer 242 may be in a range from about 10.4 GPa to about 15.6 GPa. If the second hardness is smaller than about 10.4 GPa, the third passivation layer 242 may not provide sufficient protection to the underlying structures; however, if the second hardness is greater than about 15.6 GPa, delamination may occur between two adjacent passivation layers. In some embodiments, a thickness of the third passivation layer 242 is in a range from about 500 nm to about 1800 nm. When the thickness of the third passivation layer 242 is smaller than about 500 nm, the mechanical strength of the formed semiconductor die might be insufficient. On the other hand, when the thickness of the third passivation layer 242 is greater than about 1800 nm, the thermal stress of the third passivation layer 242 might cause serious warpage in packaging (e.g., when the package temperature cools down during the reflow process). In some embodiments, a ratio of the thickness of the third passivation layer 242 to the thickness of the second passivation layer 240 is in a range from about 3 to about 6. When the ratio is within such a range, warpage may be further reduced while proper mechanical strength remains. In some embodiments, the third passivation layer 242 is formed of silicon oxide such as USG or $SiO_2$. In some further embodiments, reduced modulus of the third passivation layer 242 may be in a range from about 70.4 GPa to about 105.6 GPa, and the third passivation layer 242 having the reduced modulus within such range may provide proper stress. When the reduced modulus of the third passivation layer 242 is not within such range, the adhesion between the third passivation layer 242 and its adjacent layer (e.g., the second passivation layer 240 or a subsequently formed passivation layer overlying the third passivation layer) may be unsatisfactory, In other embodiments, a coefficient of thermal expansion (CTE) of the third passivation layer 242 may be in a range from about 0.4 ($*10^{-6 \cdot \circ} C.^{-1}$) to about 0.6 ($*10^{-6 \cdot \circ} C.^{-1}$), so that the adhesion between the third passivation layer 242 and its adjacent layer (e.g., the second passivation layer 240 or a subsequently formed passivation layer overlying the third passivation layer) may be satisfactory.

In some embodiments, the third passivation layer 242 may be made of USG which is formed by high density plasma CVD (HDPCVD), because HDPCVD can form an USG film with higher hardness than an USG film formed using PECVD. The HDPCVD performs a deposition operation and an etching operation simultaneously. The thicker third passivation layer 242 formed over corners of the tops of the second metal pads 236 may be etched to prevent the tops of the gaps 231 between two of the second metal pads 236 from being sealed. In addition, portions of the third passivation layer 242 over a top of each of the second metal pads 236 and in the gaps 231 are thicker than a portion of the third passivation layer 242 over sidewalls of each of the second metal pads 236. In some embodiments, the HDPCVD is performed at a temperature of about 200° C. to about 600° C. by using silane (e.g., $SiH_4$) and $O_2$ as precursors. When the temperature is about 200° C. to about 600° C., the third passivation layer 242 may have a desired atomic ratio of silicon to oxygen for realizing a predetermined refractive index and extinction coefficient for its subsequent application, for example, Si/O ratio may be in a range from about 1 to about 4. In some embodiments, a bias radio frequency (rf) power of the HDPCVD may be about 3500 W to about 7500 W. A proper deposition rate may be realized under such a bias rf power. In yet another embodiment, a flow rate of the silane precursor is in a range from about 20000 sccm to about 34000 sccm. In some other embodiments, a flow rate of the $O_2$ is in a range from about 165 sccm to about 205 sccm. The flow rate of the precursors may affect the deposition rate and the atomic ratio of the silicon to oxygen. When the flow rates of the precursors are controlled, properties such as the hardness, the refractive index or the extinction coefficient may be adequately controlled.

Figure 8:
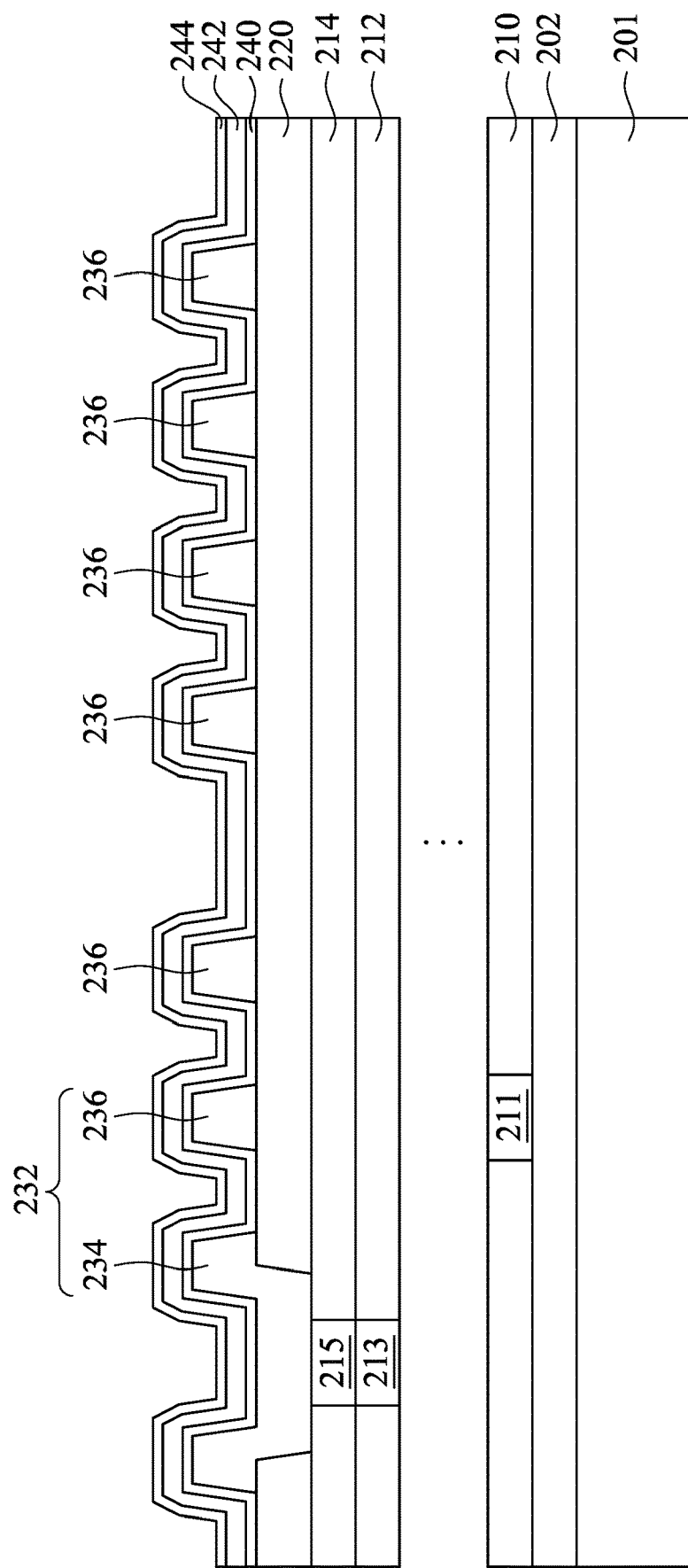

Reference is made to FIG. 1A and FIG. 8. At operation 114, a fourth passivation layer 244 is conformally deposited over the third passivation layer 242. The fourth passivation layer 244 is thinner and has lower hardness than the third passivation layer 242. Therefore, the fourth passivation layer 244 bears lower thermal stress than the third passivation layers 242 when the package temperature cools down in the reflow process. Compared to merely reducing the thickness of the third passivation layer 242 to reduce substrate warpage, a combination of the third passivation layer 242 and the fourth passivation layer 244 has additional advantages such as sufficient mechanical strength, in addition to reducing substrate warpage. Process parameters for forming the fourth passivation layer 244 are described below.

In some embodiments, the fourth passivation layer 244 having a third hardness is formed by a deposition operation having a deposition rate in a range from about 10 nm/second to about 30 nm/second. When the deposition rate is in such a range, a desired hardness of the fourth passivation layer 244 may be realized. For example, the third hardness of the fourth passivation layer 244 may be in a range from about 8 GPa to about 12 GPa. If the third hardness is smaller than about 8 GPa, the fourth passivation layer 244 may not provide sufficient protection to the underlying structures; however, if the third hardness is greater than about 12 GPa, delamination may occur between two adjacent passivation layers. In some embodiments, a thickness of the fourth passivation layer 244 is in a range from about 200 nm to about 800 nm. When a thickness of the fourth passivation layer 244 is smaller than about 200 nm, the mechanical strength of the semiconductor die is insufficient. On the other hand, when the thickness of the fourth passivation layer 244 is greater than about 800 nm, substrate warpage cannot be reduced. In some embodiments, the thickness of the fourth passivation layer 244 may be the same as the thickness of the second passivation layer 240. In some other embodiments, the thickness of the fourth passivation layer 244 may be greater than the thickness of the second passivation layer 240. In some embodiments, a ratio of the thickness of the third passivation layer 242 to the thickness of the fourth passivation layer 244 is in a range from about 1.5 to about 4. When the ratio is within such a range, substrate warpage may be further improved while proper mechanical strength remains. In some embodiments, the fourth passivation layer 244 is formed of silicon oxide such as undoped silicate glass (USG) or silicon dioxide ($SiO_2$). In some further embodiments, reduced modulus of the fourth passivation layer 244 may be in a range from about 68 GPa to about 102 GPa, and the fourth passivation layer 244 having the reduced modulus within such range may provide proper stress. When the reduced modulus of the fourth passivation layer 244 is not within such range, the adhesion between the fourth passivation layer 244 and its adjacent layer (e.g., the third passivation layer 242 or a subsequently formed passivation layer overlying the fourth passivation layer) may be unsatisfactory. In other embodiments, a coefficient of thermal expansion (CTE) of the fourth passivation layer 244 may be in a range from about 0.48 ($*10^{-6,\circ}$ $C.^{-1}$) to about 0.72 ($*10^{-6,\circ}$ $C.^{-1}$), so that the adhesion between the fourth passivation layer 244 and its adjacent layer (e.g., the third passivation layer 242 or a subsequently formed passivation layer overlying the fourth passivation layer) may be satisfactory.

In some embodiments, the fourth passivation layer 244 may be made of USG which is formed by plasma enhanced CVD (PECVD). In some embodiments, the PECVD is performed at a temperature of about 300° C. to about 500° C. by using silane (e.g., $SiH_4$) and $N_2O$ as precursors. When the temperature is about 300° C. to about 500° C., the fourth passivation layer 244 may have a desired atomic ratio of silicon to oxygen for realizing a predetermined refractive index and extinction coefficient for its subsequent application, for example, Si/O ratio may be in a range from about 1 to about 4. In yet another embodiment, a flow rate of the silane precursor is in a range from about 600 sccm to about 750 sccm. In some other embodiments, a flow rate of the $N_2O$ is in a range from about 12000 sccm to about 20000 sccm. The flow rate of the precursors may affect the deposition rate and the atomic ratio of the silicon to oxygen. When the flow rates of the precursors are controlled, properties such as the hardness, the refractive index or the extinction coefficient may be adequately controlled. In some other embodiments, the fourth passivation layer 244 may be formed of a material that is different from the material of the second passivation layer 240.

In some embodiments, the first hardness of the second passivation layer 240 is smaller than the second hardness of the third passivation layer 242. In some other embodiments, the third hardness of the fourth passivation layer 244 is smaller than the second hardness of the third passivation layer 242. In some still other embodiments, the first hardness may be equal to, smaller than or greater than the third hardness. A difference between the second hardness and the first hardness and a difference between the second hardness and the third hardness are respectively about 2.4 GPa to about 7.6 GPa, so that the composite passivation layers may have adequate toughness and strength. In some embodiments, the reduced modulus of the second passivation layer 240 is smaller than the reduced modulus of the third passivation layer 242. In some other embodiments, the reduced modulus of the fourth passivation layer 244 is smaller than the reduced modulus of the third passivation layer 242. In some still other embodiments, the reduced modulus of the second passivation layer 240 may be equal to, smaller than or greater than the reduced modulus of the fourth passivation layer 244. A difference between the reduced modulus of the third passivation layer 242 and the second passivation layer 240, and a difference between the reduced modulus of the third passivation layer 242 and the fourth passivation layer 244 are respectively about 2.4 GPa to about 37.6 GPa, so that the composite passivation layers may have adequate toughness and strength. In some embodiments, the second, third and fourth passivation layers 240, 242 and 244 may have similar or the same CTE, so that proper adhesion between two adjacent passivation layers can be realized when the reflow operation is performed. Particularly, with such second, third and fourth passivation layers 240, 242 and 244 sequentially arranged, the composite passivation layer has low thermal stress and high fracture toughness, and thus substrate warpage may be reduced. Furthermore, the composite passivation layer has sufficient mechanical strength to avoid cracks in the passivation layers during the packaging process.

Figure 9:
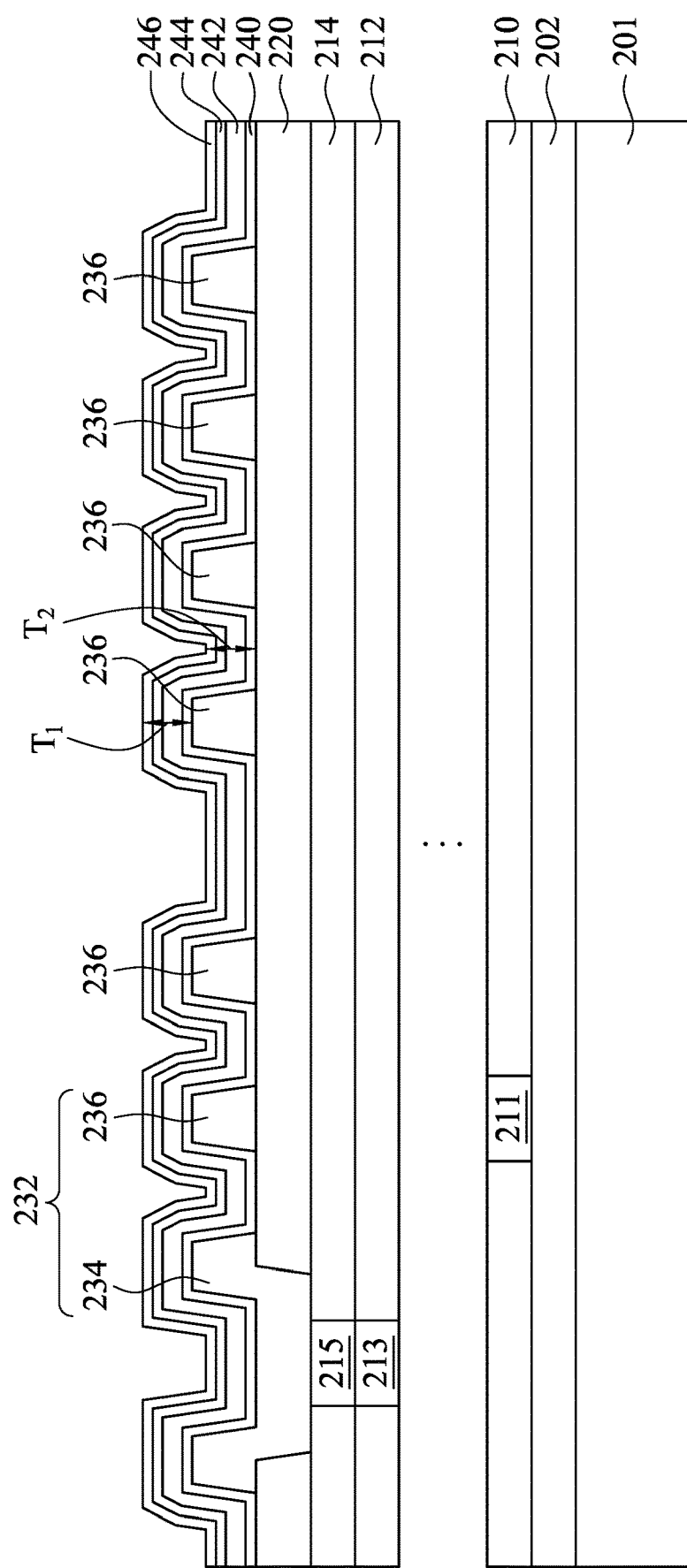

Reference is made to FIG. 1B and FIG. 9. At operation 116, the composite passivation layer further includes a fifth passivation layer 246 deposited over the fourth passivation layer 244. In some embodiments, depositing the fifth passivation layer 246 may be performed by CVD, spin-coating, or other suitable techniques. In some embodiments, the fifth passivation layer 246 may be formed from a nitride-based dielectric material, rather than the oxide-based materials of the underlying passivation layers 240-244. For example, the fifth passivation layer 246 includes silicon nitride (SiN), silicon oxynitride (SiON) or combinations thereof. In some embodiments, a thickness of the fifth passivation layer 246 is in a range from about 500 nm to about 1000 nm. A sum of the thicknesses of the second, third, fourth and fifth passivation layers 240, 242, 244 and 246 on top of each one of the second metal pads 236 is defined as $T_1$, and a sum of thicknesses of the second, third, fourth and fifth passivation layers 240, 242, 244 and 246 between two of the second metal pads 236 is defined as $T_2$. In some embodiments, a ratio of $T_2$ to $T_1$ is in a range about 0.6 to about 0.9. When $T_2/T_1$ is smaller than 0.6, the mechanical strength of the composite passivation layer is insufficient, and cracks may occur during the packaging process. However, $T_2/T_1$ greater than 0.9 is difficult to realize because of apparatus limitations.

Figure 10:
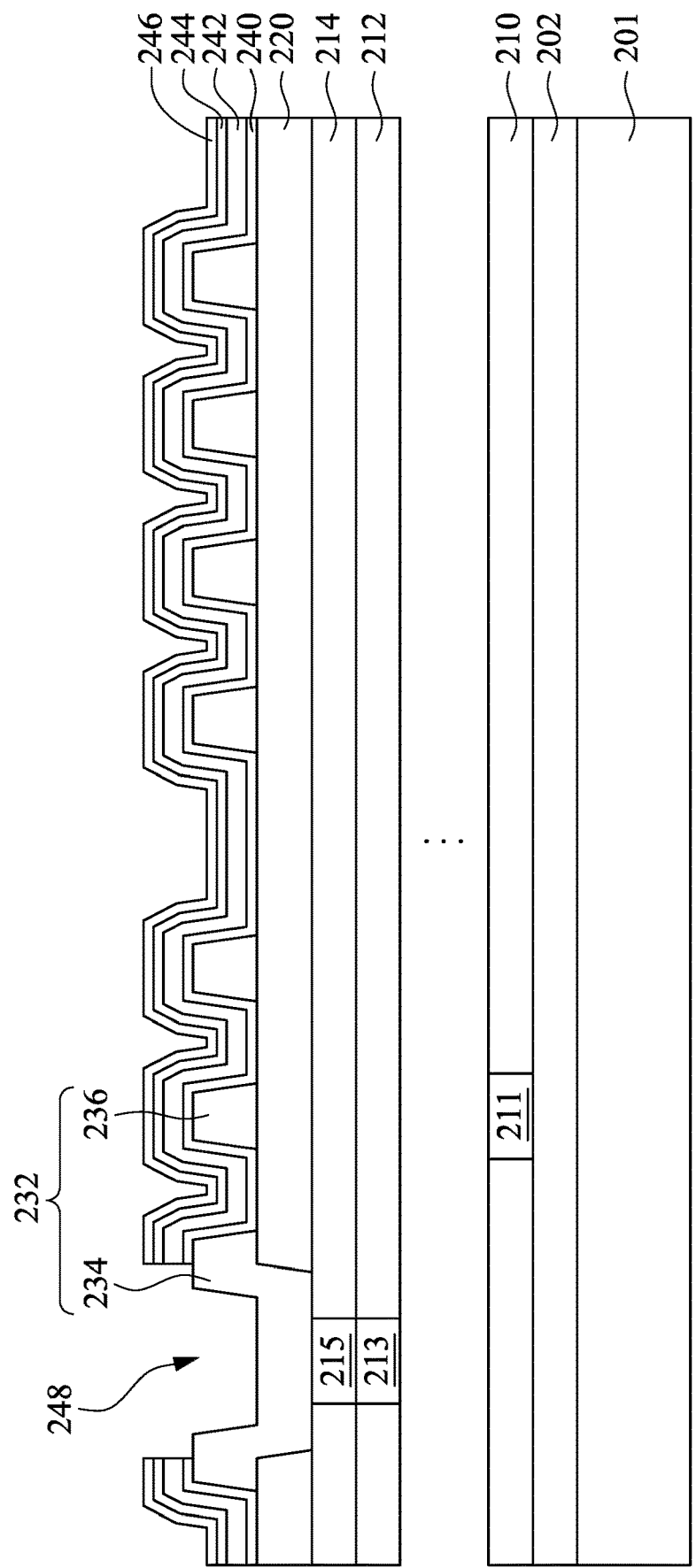

Reference is made to FIG. 1B and FIG. 10. At operation 118, portions of the second, third, fourth and fifth passivation layers 240, 242, 244 and 246 on the first metal pad 234 are removed, so as to form a second opening 248, and a portion of the first metal pad 234 is exposed from the second opening 248. In some embodiments, a photolithography operation and an etching operation are performed to define the second opening 248. In some embodiments where the second, third and fourth passivation layers 240, 242 and 244 are made of USG and the fifth passivation layer 246 is made of silicon nitride, the fifth passivation layer 246 may be removed by a wet process using hot $H_3PO_4$, and then the second, third and fourth passivation layers 240, 242 and 244 may be removed using diluted HF. As shown in FIG. 10, the second, third, fourth and fifth passivation layers 240, 242, 244 and 246 partially cover the first metal pad 234.

Figure 11:
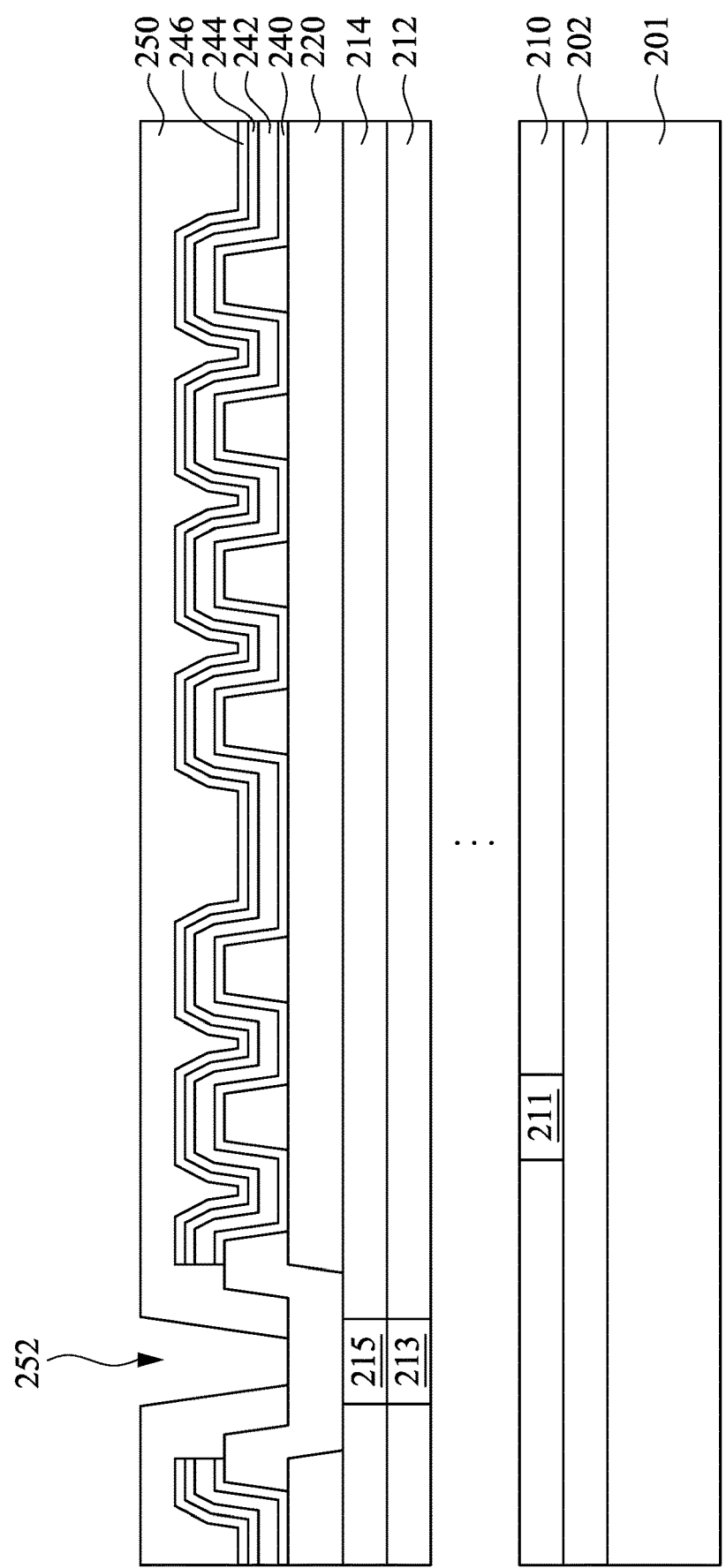

Reference is made to FIG. 1B, FIG. 10 and FIG. 11. At operation 120, a first buffer layer 250 is formed over the fifth passivation layer 246. A third opening 252 is formed in the first buffer layer 250 and a portion of the first metal pad 234 is exposed through the third opening 252. The third opening 252 is a combined opening of the second opening 248; in other words, the third opening 252 is partially overlapped with the second opening 248. In some embodiments, forming the first buffer layer 250 may include depositing a material of the first buffer layer 250 in the second opening 248 and over the fifth passivation layer 246, followed by patterning the first buffer layer 250 to define the third opening 252. In some embodiments, the material of the first buffer layer 250 may include polyimide, polybenzobisoxazole (PBO), benzocyclobutene (BCB), epoxy and the like, although other relatively soft, often organic, dielectric materials can also be used. The first buffer layer 250 serves as a stress buffer to reduce mechanical stress transfer to the passivation layers during packaging.

Figure 12:
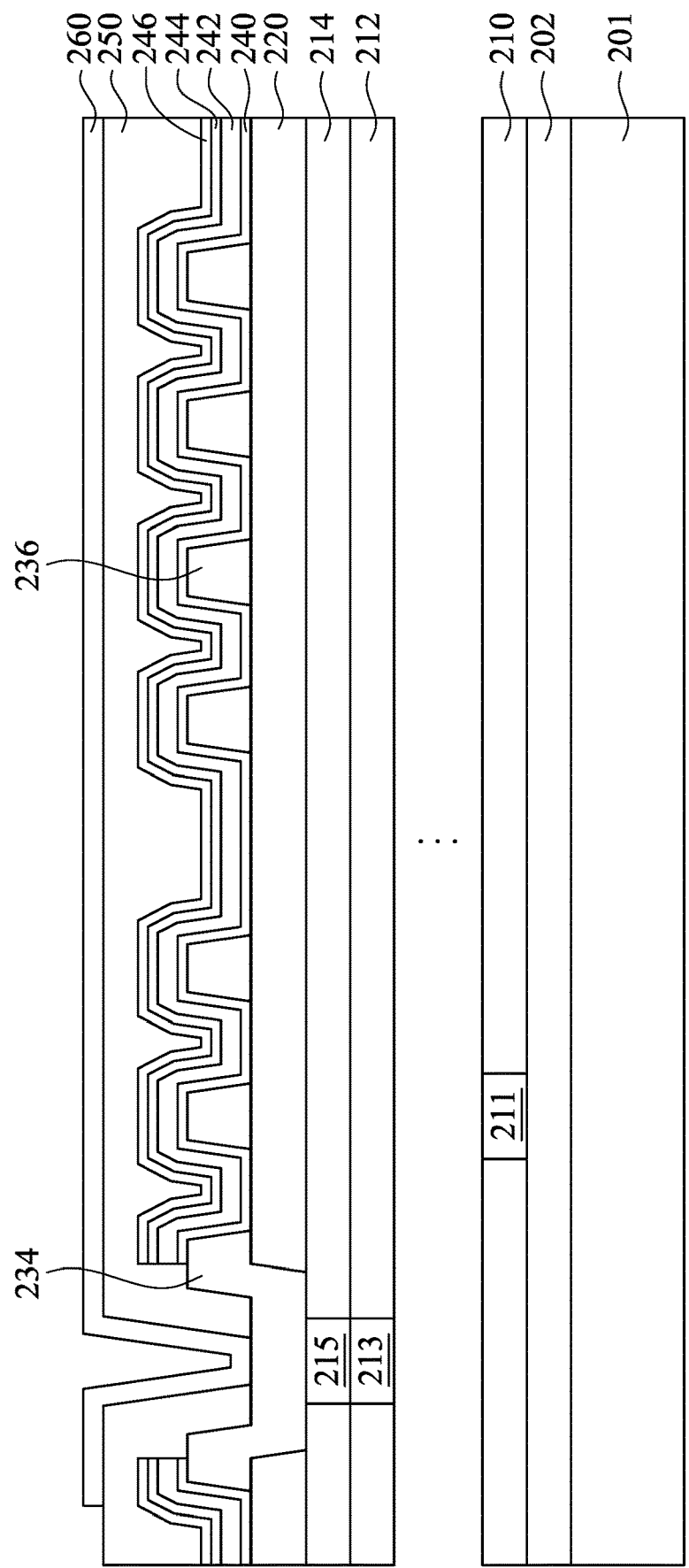

Reference is made to FIG. 1B, FIG. 11 and FIG. 12. At operation 122, a post passivation interconnection (PPI) layer 260 is formed over the first buffer layer 250 and the first metal pad 234. The PPI layer 260 is conformal to the third opening 252 and electrically connected to the first metal pad 234. In some embodiments, the PPI layer 260 is formed of a conductive material including, but not limited to, for example copper, aluminum, copper alloy, nickel, or other conductive materials. In some embodiments, the PPI layer 260 may be formed by a plating operation. In other embodiments, the PPI layer 260 electrically connects the electrical components in the semiconductor substrate 201 to a subsequently-formed solder ball 290.

Figure 13:
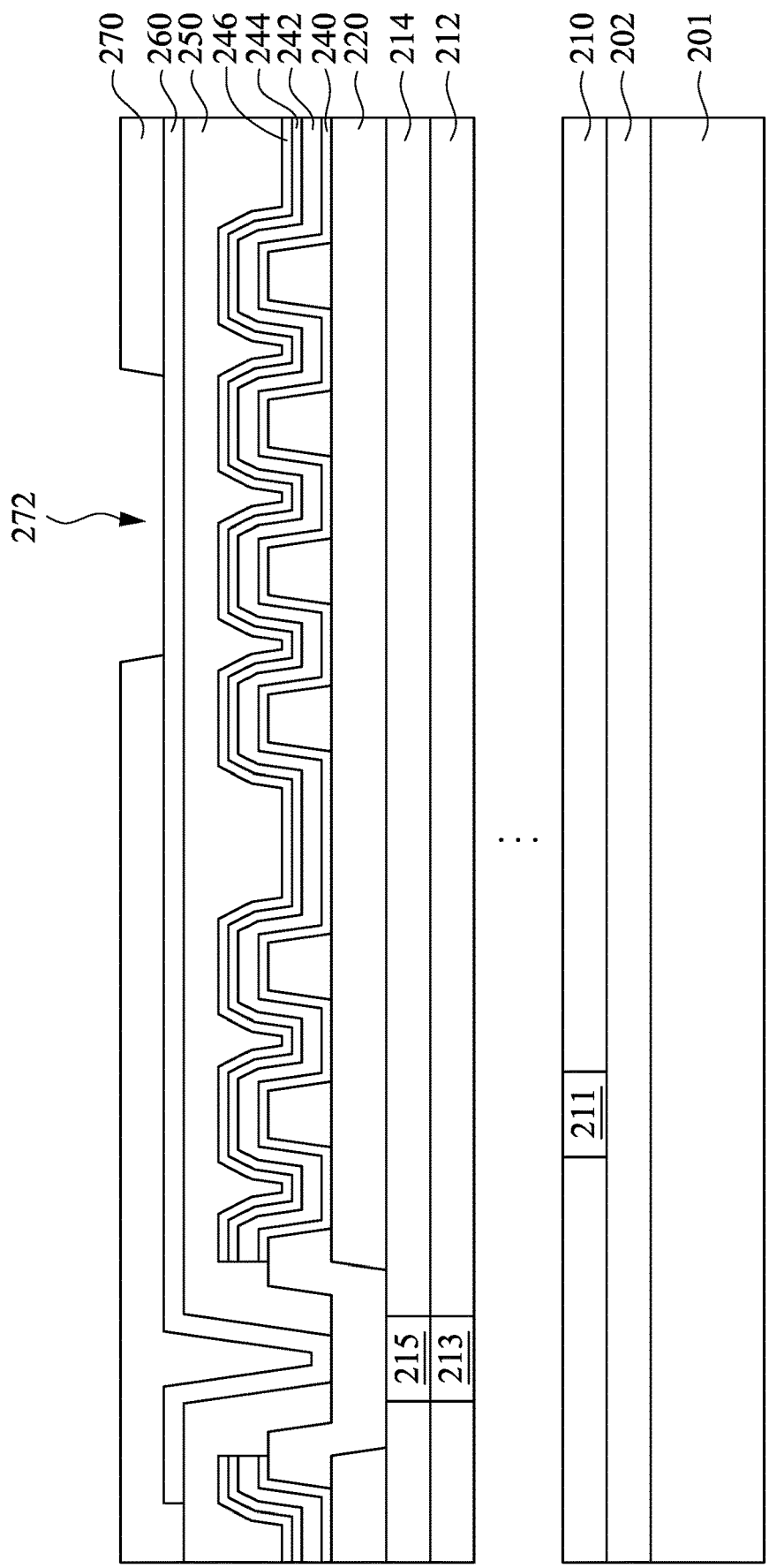

Reference is made to FIG. 1B and FIG. 13. At operation 124, a second buffer layer 270 is formed over the PPI layer 260. In some embodiments, the second buffer layer 270 is deposited over the PPI layer 260, and then the second buffer layer 270 is patterned to form a fourth opening 272 that exposes a portion of the PPI layer 260. In some embodiments, the material of the second buffer layer 270 may include polyimide, polybenzobisoxazole (PBO), benzocyclobutene (BCB), epoxy and the like, although other relatively soft, often organic, dielectric materials can also be used.

Figure 14:
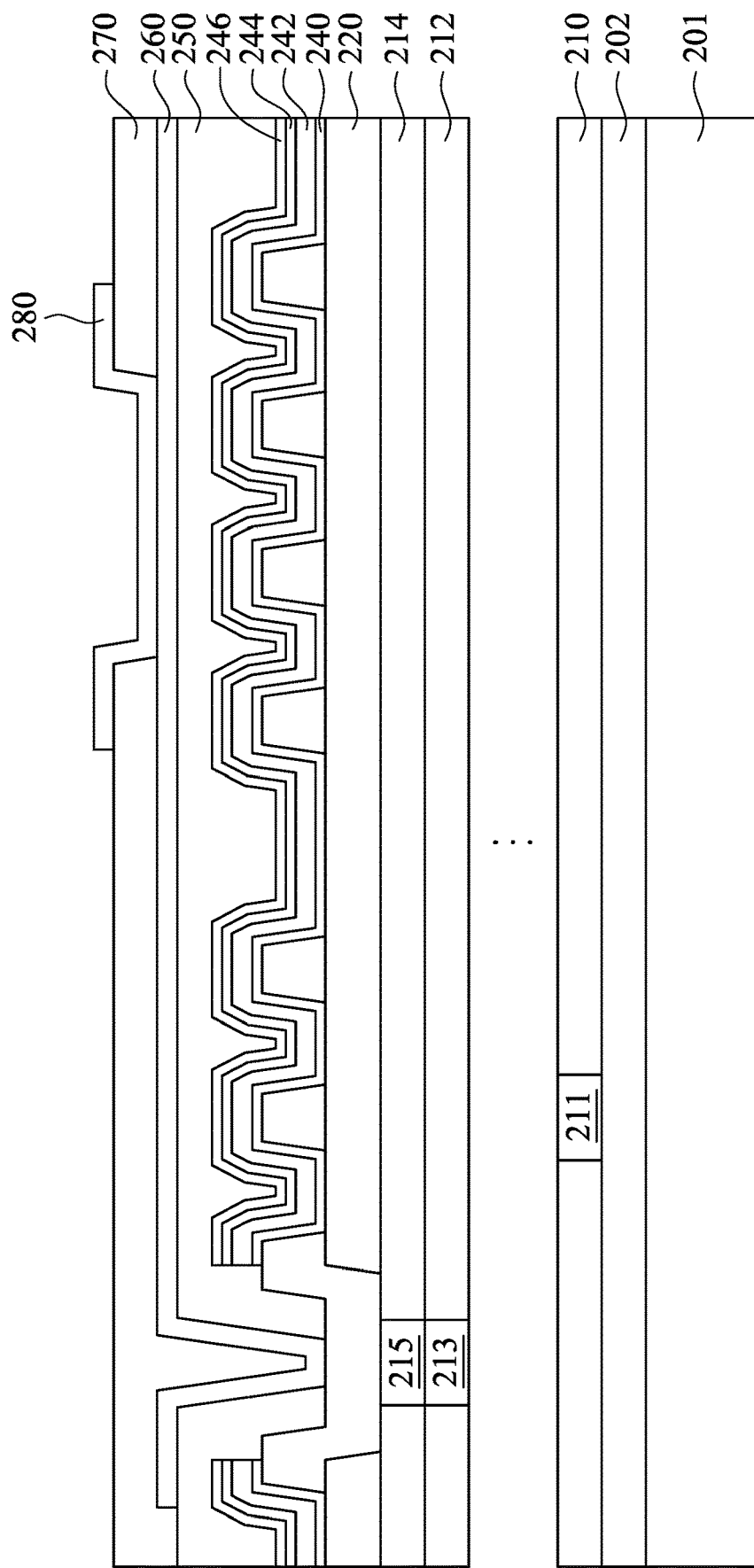

Reference is made to FIG. 1B, FIG. 13 and FIG. 14. At operation 126, an under bump metallurgy (UBM) layer 280 is formed in the fourth opening 272 and over the second buffer layer 270. As shown in FIG. 14, the UBM layer 280 lines sidewalls of the fourth opening 272 and contacts the exposed portion of the PPI layer 260. In some embodiments, the UBM layer 280 may include multiple layers of conductive materials, such as a layer of titanium and a layer of copper. Each layer in the UBM layer 280 may be formed using a plating process, such as electrochemical plating, although other processes of formation, such as sputtering, evaporation, electroless plating, or plasma enhanced chemical vapor deposition (PECVD), may alternatively be used depending upon the materials used for the UBM layer 280.

Figure 15:
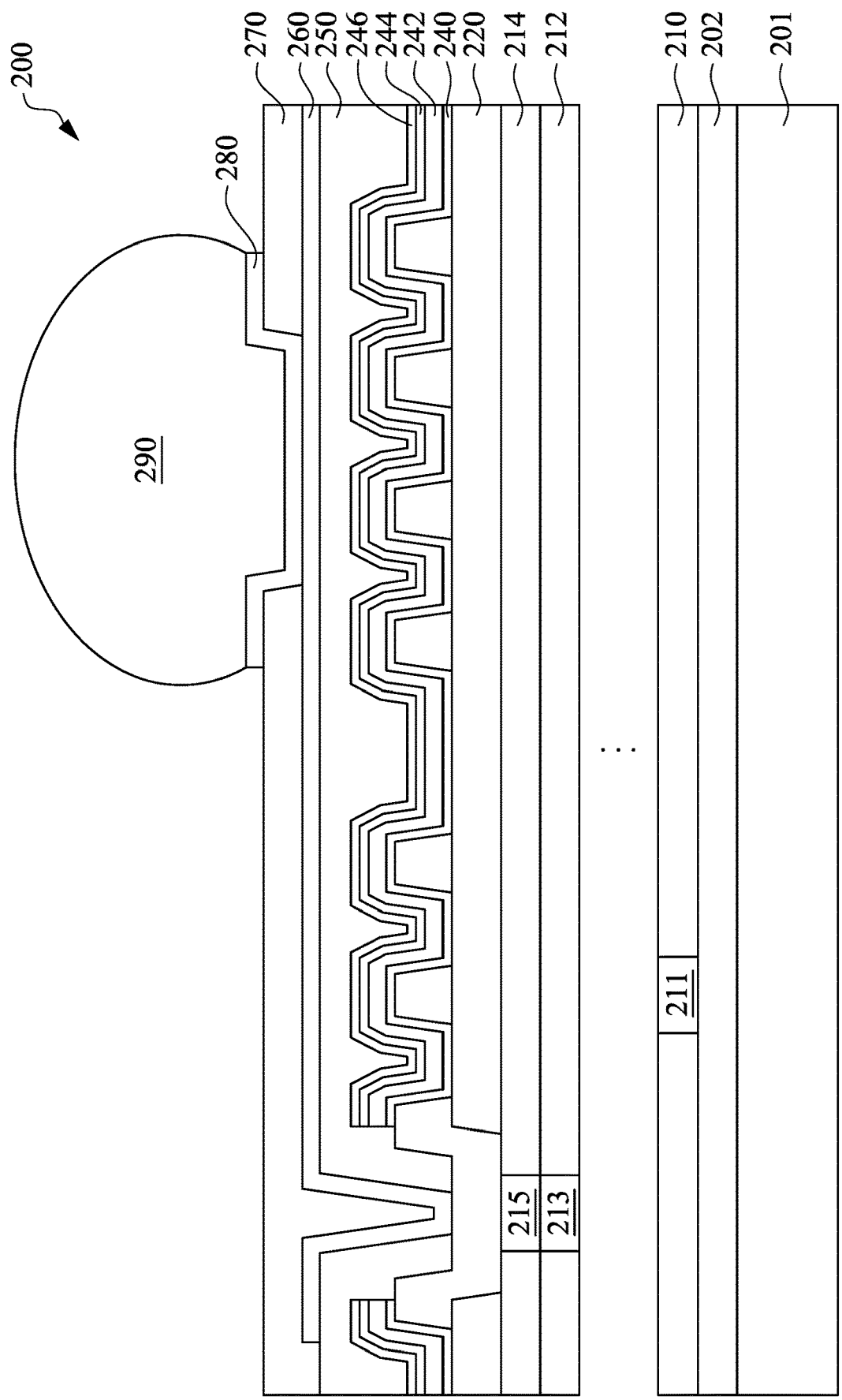

Reference is made to FIG. 1B and FIG. 15. At operation 128, a solder ball 290 is formed on the UBM layer 280. In some embodiments, forming the solder ball 290 may include forming a photoresist layer (not shown) over the second buffer layer 270 and the UBM layer 280, and patterning the photoresist layer to form a hole (not shown) that exposes the UBM layer 280. The photoresist layer acts as a mold for a metal deposition process used for forming the solder ball 290. In some embodiments, the photoresist material is compatible with conventional equipment and standard ancillary process chemicals used in electroplating. Next, a conductive material may fill a portion of the hole by evaporation, electroplating, or screen printing to form the solder ball 290 over the UBM layer 280. The conductive material may be any of a variety of metals or metal alloys. For example, the conductive material may be copper, tin, silver or gold. After the solder ball 290 is formed, the photoresist layer may be removed.

In some embodiments, a wafer dicing operation (i.e., die sawing operation) may be performed to separate the semiconductor dies on the wafer after forming the solder ball 290, as shown at operation 130.

Figure 16:
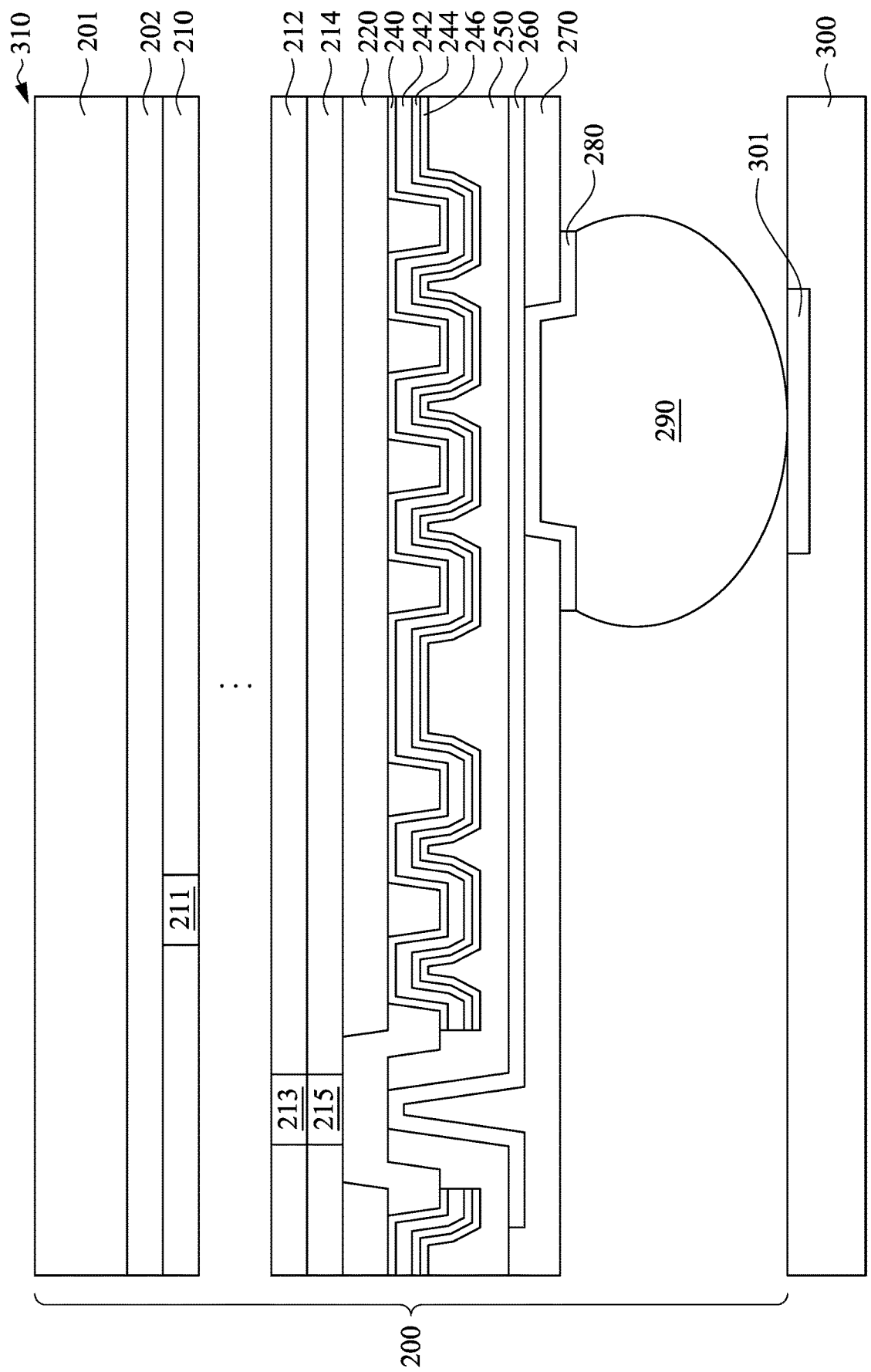

Reference is made to FIG. 1B and FIG. 16. At operation 132, the semiconductor die 200 is bonded to a conductive element 301 of an external device 300, thereby forming a package structure 310 of FIG. 16. In some embodiments, the external device 300 may include, but is not limited to, a PCB board, a memory device, a CPU, or other devices possessing electrical I/O. For example, the PCB board may be a double-sided PCB board. In some embodiments, bonding the semiconductor die 200 to the external device 300 includes performing a reflow operation to form an electrical connection between the semiconductor die 200 and the external device 300. In some embodiments, the reflow operation includes heating the package structure 310 from a first temperature to a second temperature, maintaining the second temperature for a time period, followed by cooling the package structure 310 from the second temperature to a third temperature. In some embodiments, the first temperature is in a range from about 25° C. to about 75° C. In some embodiments, the second temperature is in a range from about 230° C. to about 275° C. In some embodiments, the third temperature is in a range from about 25° C. to about 75° C. In some embodiments, the time period of the reflow operation may be from about 60 minutes to about 180 minutes. When the temperature of the reflow operation is controlled under such conditions, the electrical connection between the semiconductor die 200 and the external device 300 may be improved without increasing substrate warpage.

Figure 17:
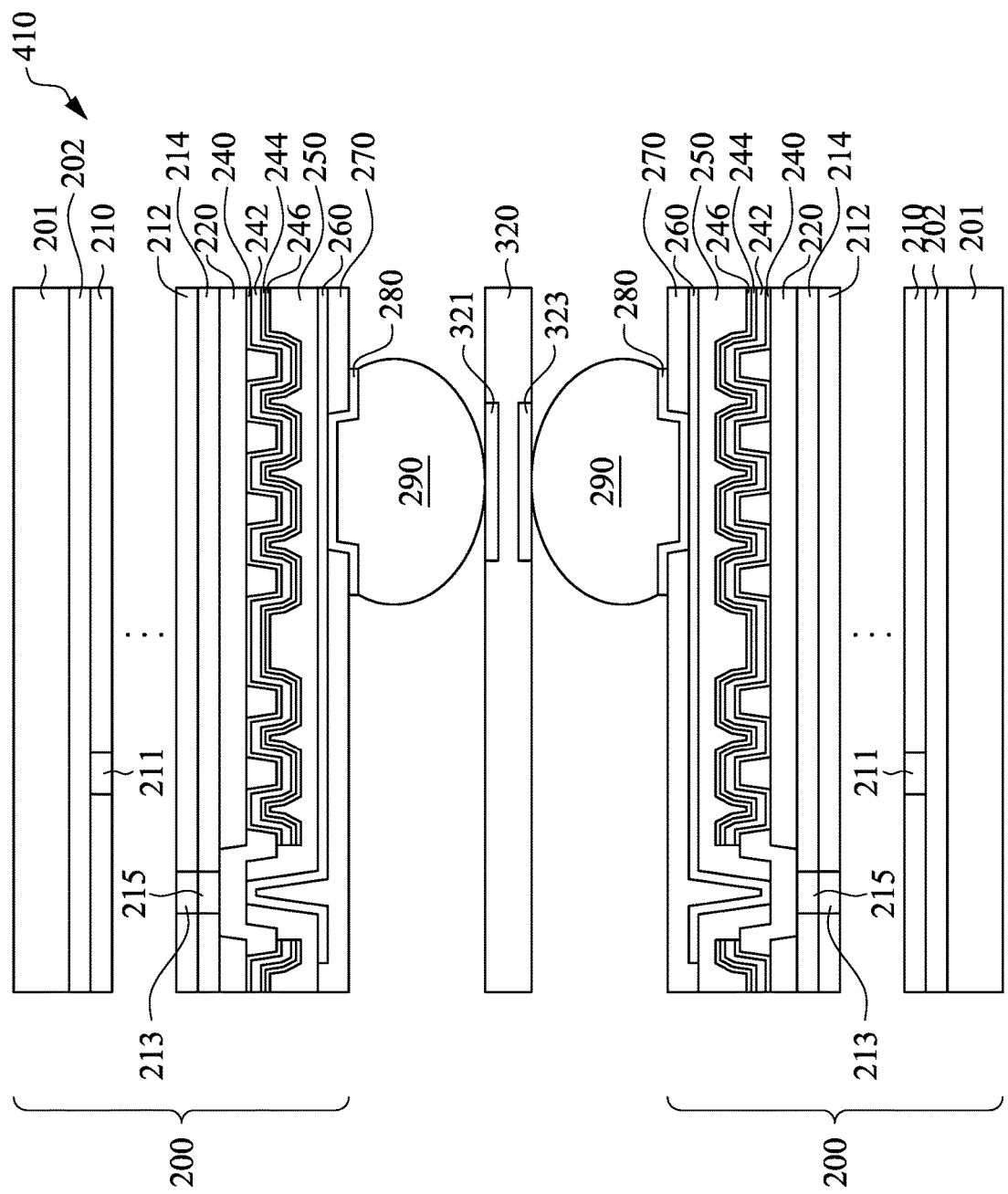
FIG. 17 is a schematic sectional view of a package structure in accordance with some embodiments of the present disclosure.

FIG. 17 is a schematic sectional view of a package structure in accordance with some embodiments of the present disclosure. In some embodiments, two semiconductor dies 200 are respectively bonded to conductive elements 321 and 323 disposed on opposing two sides of an external device 320, thereby forming a package structure 410. In such embodiments, the external device 320 is a double-sided PCB board. Bonding the two semiconductor dies 200 onto the external device 320 may include the reflow operation described at operation 132 and with reference to FIG. 16.

In some embodiments, compared to a composite passivation layer A without the fourth passivation layer 244 (i.e., in which the thickness of the third passivation layer 242 is T3), the composite passivation layer B with the fourth passivation layer 244 (i.e., in which a sum of the thicknesses of the third and fourth passivation layers 242 and 244 is T3) bears a smaller thermal stress during the reflow operation. In addition, fracture strength of the composite passivation layer B is greater than fracture strength of the composite passivation layer A. Furthermore, the board level reliability of the package structure with the composite passivation layer B is greater than the board level reliability of the package structure with the composite passivation layer A.

Embodiments of the present disclosure may have at least the advantages outlined below. A combination of the passivation layer(s) having small hardness and small thickness and the passivation layer having great hardness and great thickness effectively reduces the thermal stress and increases the fracture toughness and the mechanical strength of the composite passivation layer. Therefore, substrate warpage of the semiconductor die occurring during the reflow operation is reduced, and the board level reliability of the package structure is improved.

In some embodiments, a method is provided. A bottom passivation layer is formed on a dielectric layer over a semiconductor substrate. Then, a first opening is formed in the bottom passivation layer to expose a portion of the dielectric layer. Next, a metal pad is formed in the first opening. Afterwards, a first oxide-based passivation layer is formed over the metal pad. Then, a second oxide-based passivation layer is formed over the first oxide-based passivation layer. The second oxide-based passivation layer has a hardness less than a hardness of the first oxide-based passivation layer.

In some embodiments, a method is provided. A bottom passivation layer is formed on a dielectric layer over a semiconductor substrate. Next, a first opening is formed in the bottom passivation layer to expose a portion of the dielectric layer. Then, a metal pad is formed in the first opening and over the bottom passivation layer. Afterwards, a first oxide-based passivation layer is deposited over the metal pad at a first deposition rate. Then, a second oxide-based passivation layer is deposited over the first oxide-based passivation layer at a second deposition rate faster than the first deposition rate.

In some embodiments, semiconductor die is provided. The semiconductor die includes a semiconductor substrate, a dielectric layer over the semiconductor substrate, a metal structure in the dielectric layer, a first metal pad over the metal structure, a first oxide-based passivation layer over the first metal pad, a second oxide-based passivation layer over the first oxide-based passivation layer, and a bump electrically connected to the first metal pad. The second oxide-based passivation layer has a hardness less than a hardness of the first oxide-based passivation layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a bottom passivation layer on a dielectric layer over a semiconductor substrate;
   forming a first opening in the bottom passivation layer to expose a portion of the dielectric layer;
   forming a metal pad in the first opening;
   forming a first oxide-based passivation layer over the metal pad; and
   forming a second oxide-based passivation layer over the first oxide-based passivation layer, the second oxide-based passivation layer having a hardness less than a hardness of the first oxide-based passivation layer.

2. The method of claim 1, further comprising forming a third oxide-based passivation layer over the metal pad prior to forming the first oxide-based passivation layer.

3. The method of claim 2, wherein the first and second oxide-based passivation layers are formed using different chemical vapor deposition processes.

4. The method of claim 2, wherein the first and third oxide-based passivation layers are formed using different chemical vapor deposition processes.

5. The method of claim 2, wherein the second and third oxide-based passivation layers are formed using a same chemical vapor deposition process.

6. The method of claim 2, wherein the first oxide-based passivation layer is formed using a high density plasma chemical vapor deposition (HDPCVD).

7. The method of claim 2, wherein the second and third oxide-based passivation layers are formed using plasma enhanced chemical vapor deposition (PECVD).

8. The method of claim 1, further comprising:
removing portions of the first and second oxide-based passivation layers to expose the metal pad;
forming a post passivation interconnect (PPI) layer on the metal pad;
forming a buffer layer over the PPI layer;
forming a second opening in the buffer layer;
forming an under bump metallurgy (UBM) layer in the second opening of the buffer layer and in contact with the PPI layer; and
forming a solder ball on the UBM layer.

9. A method, comprising:
forming a bottom passivation layer on a dielectric layer over a semiconductor substrate;
forming a first opening in the bottom passivation layer to expose a portion of the dielectric layer;
forming a metal pad in the first opening and over the bottom passivation layer;
depositing a first oxide-based passivation layer over the metal pad at a first deposition rate; and
depositing a second oxide-based passivation layer over the first oxide-based passivation layer at a second deposition rate faster than the first deposition rate.

10. The method of claim 9, wherein depositing the second oxide-based passivation layer is performed such that the second oxide-based passivation layer has a thickness less than a thickness of the first oxide-based passivation layer.

11. The method of claim 9, further comprising:
prior to depositing the first oxide-based passivation layer, depositing a third oxide-based passivation layer over the metal pad at a third deposition rate faster than the first deposition rate.

12. The method of claim 11, wherein depositing the first oxide-based passivation layer is performed such that a thickness of the first oxide-based passivation layer is greater than a thickness of the third oxide-based passivation layer.

13. The method of claim 11, wherein depositing the second and third oxide-based passivation layers is performed by using silane and $N_2O$ as precursors.

14. The method of claim 9, wherein depositing the first oxide-based passivation layer is performed using silane and $O_2$ as precursors.

15. The method of claim 9, further comprising:
forming a nitride-based passivation layer over the second oxide-based passivation layer.

16. A semiconductor die, comprising:
a semiconductor substrate;
a dielectric layer over the semiconductor substrate;
a metal structure in the dielectric layer;
a first metal pad over the metal structure;
a first oxide-based passivation layer over the first metal pad;
a second oxide-based passivation layer over the first oxide-based passivation layer and having a hardness less than a hardness of the first oxide-based passivation layer; and
a bump electrically connected to the first metal pad.

17. The semiconductor die of claim 16, further comprising a nitride-based passivation layer over the second oxide-based passivation layer.

18. The semiconductor die of claim 16, wherein a thickness of the first oxide-based passivation layer is greater than a thickness of the second oxide-based passivation layer.

19. The semiconductor die of claim 17, further comprising:
a third oxide-based passivation layer between the first metal pad and the first oxide-based passivation layer and having a hardness less than the hardness of the first oxide-based passivation layer.

20. The semiconductor die of claim 16, further comprising:
a second metal pad under the first oxide-based passivation layer and separated from the first metal pad, the second metal pad having a bottom higher than a bottom of the first metal pad.

* * * * *